US009524951B2

(12) United States Patent
Hohlfeld (10) Patent No.: US 9,524,951 B2
(45) Date of Patent: Dec. 20, 2016

(54) SEMICONDUCTOR ASSEMBLY COMPRISING CHIP ARRAYS (71) Applicant: Infineon Technologies AG, Neubiberg (DE)

(72) Inventor: Olaf Hohlfeld, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/669,208

(22) Filed: Mar. 26, 2015

(65) Prior Publication Data

US 2015/0287698 A1 Oct. 8, 2015

(30) Foreign Application Priority Data

Apr. 3, 2014 (DE) .................. 10 2014 104 718

(51) Int. Cl.
| | |
|---|---|
| *H01L 25/065* | (2006.01) |
| *H01L 23/10* | (2006.01) |
| *H01L 23/492* | (2006.01) |
| *H01L 23/04* | (2006.01) |
| *H01L 23/31* | (2006.01) |
| *H01L 23/48* | (2006.01) |
| *H01L 25/07* | (2006.01) |
| *H01L 23/051* | (2006.01) |

(52) U.S. Cl.
CPC .......... *H01L 25/0655* (2013.01); *H01L 23/04* (2013.01); *H01L 23/051* (2013.01); *H01L 23/10* (2013.01); *H01L 23/3142* (2013.01); *H01L 23/48* (2013.01); *H01L 23/492* (2013.01); *H01L 25/07* (2013.01); *H01L 2924/0002* (2013.01)

(58) Field of Classification Search
CPC ........ H01L 23/48; H01L 25/07; H01L 23/051; H01L 23/04; H01L 23/10; H01L 23/3142; H01L 23/492; H01L 25/0655; H01L 23/065; H01L 24/72; H01L 2924/0002; H01L 2924/00
USPC ............... 257/688, 689, 693, 398, 699, 710, 723,257/685, 712, 713, 181, E23.078, E23.187
See application file for complete search history.

(56) References Cited

U.S. PATENT DOCUMENTS

| | | | | |
|---|---|---|---|---|
| 5,489,802 A | * | 2/1996 | Sakamoto ............. | H01L 23/051 257/688 |
| 5,519,231 A | * | 5/1996 | Nakashima ........... | H01L 23/051 257/181 |
| 5,610,439 A | * | 3/1997 | Hiyoshi ................ | H01L 23/051 257/688 |

(Continued)

*Primary Examiner* — Alexander Oscar Williams
(74) *Attorney, Agent, or Firm* — Murphy, Bilak & Homiller, PLLC (57) ABSTRACT A semiconductor assembly includes a frame having at least one opening, an identical number of electrically conductive first contact plates, and an identical number of chip arrays. Each chip array has a number of semiconductor chips that are cohesively connected to one another by an embedding compound. In addition, each of the semiconductor chips has a first load terminal and a second load terminal arranged at mutually opposite sides of the relevant semiconductor chip. One of the chip arrays is inserted into each of the openings. Each of the first contact plates is arranged above one of the chip arrays in such a way that, for each of the semiconductor chips, the first load terminal is situated at a side of said semiconductor chip facing the first contact plate and the second load terminal is situated a of said semiconductor chip facing away from the first contact plate.

15 Claims, 6 Drawing Sheets

(56) References Cited

U.S. PATENT DOCUMENTS

| | | | | |
|---|---|---|---|---|
| 5,708,299 A | * | 1/1998 | Teramae | H01L 24/72 |
| | | | | 257/718 |
| 5,866,944 A | * | 2/1999 | Hiyoshi | H01L 23/051 |
| | | | | 257/178 |
| 5,990,501 A | * | 11/1999 | Hiyoshi | H01L 23/051 |
| | | | | 257/181 |
| 6,181,007 B1 | * | 1/2001 | Yamazaki | H01L 23/051 |
| | | | | 257/718 |
| 6,373,129 B1 | * | 4/2002 | Yamazaki | H01L 23/051 |
| | | | | 257/181 |
| 6,452,261 B1 | * | 9/2002 | Kodama | H01L 25/072 |
| | | | | 257/688 |
| 2014/0346256 A1 | * | 11/2014 | Abels | A62C 31/28 |
| | | | | 239/518 |
| 2015/0102481 A1 | * | 4/2015 | Steinhoff | H01L 23/051 |
| | | | | 257/727 |

* cited by examiner

FIG 13

SEMICONDUCTOR ASSEMBLY COMPRISING CHIP ARRAYS

PRIORITY CLAIM

This application claims priority to German Patent Application No. 10 2014 104 718.4 filed on 3 Apr. 2014, the content said application incorporated herein by reference in its entirety.

BACKGROUND

Semiconductor assemblies often comprise a plurality of semiconductor chips that are to be electrically interconnected with one another. However, mounting these semiconductor chips relative to one another turns out to be very complex. In addition, in the case of very high numbers of chips, electrical contact problems can often occur, primarily if the semiconductor chips are electrically pressure-contacted.

SUMMARY

The object of the present invention is to provide a semiconductor assembly which enables simple and reliable mounting even if the semiconductor assembly contains a very large number of semiconductor chips, and also a pressure contact arrangement comprising such a semiconductor assembly.

This object is achieved by means of a semiconductor assembly as claimed in patent claim 1 and respectively by means of a pressure contact arrangement as claimed in patent claim 15. Dependent claims relate to configurations and developments of the invention.

A semiconductor assembly comprises a frame having a number of openings. The number N55 of openings is greater than or equal to one, but it can also be greater than or equal to two, greater than or equal to 4, greater than or equal to 6, or greater than or equal to 8. Furthermore, the semiconductor assembly comprises a number N55 of electrically conductive first contact plates, and a number N55 of chip arrays. Each of the chip arrays has a number N10 of semiconductor chips that are cohesively connected to one another by an embedding compound to form a fixed assemblage. N10 is greater than or equal to two. Each of the semiconductor chips has a first load terminal and a second load terminal, which are arranged at mutually opposite sides of the relevant semiconductor chip. One of the chip arrays is inserted into each of the openings. Each of the first contact plates is arranged above one of the chip arrays in such a way that, in the case of each of the semiconductor chips of said chip array, the first load terminal is situated at that side of said semiconductor chip which faces the first contact plate and the second load terminal is situated at that side of said semiconductor chip which faces away from the first contact plate.

In order to obtain a pressure contact arrangement, such a semiconductor assembly can be clamped in between a first pressure piece and a second pressure piece in such a way that there is an electrically conductive pressure contact between the first pressure piece and each of the first contact plates, and there is an electrically conductive pressure contact between the second pressure piece and each of the second contact plates.

BRIEF DESCRIPTION OF THE DRAWINGS

The invention is explained by way of example below on the basis of exemplary embodiments with reference to the accompanying figures, in which.

DETAILED DESCRIPTION

Figure 1A:
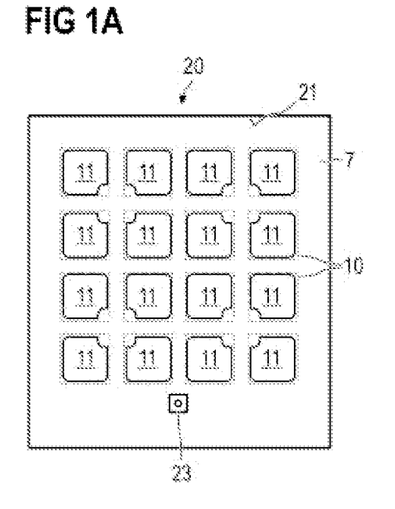
FIG. 1A shows a view of a chip array looking at the top side thereof.

FIG. 1A shows a plan view of a chip array 20 looking at the top side 21 thereof. The chip array 20 has a number N10≥2 of semiconductor chips 10 that are cohesively connected to one another by an embedding compound 7 to form a fixed assemblage. The lateral edges of the semiconductor chips 10, which may be concealed by the embedding compound 7, are illustrated with the aid of dashed lines. The chip array 20 thus forms a unit comprising a plurality of semiconductor chips 10 which exhibits good handleability. The embedding compound 7 can for example comprise plastic or consist of plastic.

Such an assemblage can be produced for example by the semiconductor chips 10 being fixed in their desired relative positions on an auxiliary carrier and the embedding compound 7 being injected or molded around said semiconductor chips, such that a fixed assemblage exists after the embedding compound 7 has been cured, which assemblage can optionally be processed even further.

Figure 1B:
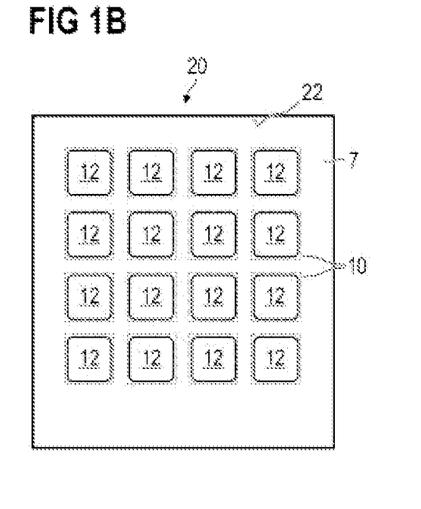
FIG. 1B shows a view of the chip array in accordance with FIG. 1A looking at the underside thereof.

Each of the semiconductor chips 10 has a first load terminal 11, which is not covered by the embedding compound 7 and can therefore be electrically contacted from outside the chip array 20. As is illustrated in the associated view shown in FIG. 1B looking at the underside 22 of the chip array 20, each of the semiconductor chips 10 also has a second load terminal 12, which is not covered by the embedding compound 7 and can therefore be electrically contacted from outside the chip array 20. In the case of each of the semiconductor chips 10, its first load terminal 11 and its second load terminal 12 are arranged at mutually opposite sides of the semiconductor chip 10.

Optionally, one, more than one or all of the semiconductor chips 10 can be embodied in each case as a controllable semiconductor switch having a control terminal such as a gate or base terminal, for example, for its electrical driving. In this case, the control terminals of these controllable semiconductor chips 10 can optionally be electrically conductively connected to one another with the aid of electrical connection lines. Such connection lines can be integrated into the chip array 20. In this case, the connection lines can be completely or partly embedded into the embedding compound 7, or else be applied partly to the outer surface of the embedding compound 7.

Provided that the chip array 20 contains at least two controllable semiconductor chips 10, the control terminals thereof can be brought together at a common control terminal location 23 of the chip array 20, as shown in FIG. 1A. The control terminal location 23 is accessible from outside the chip array 20 in order to enable external contacting of the control terminals via the common control terminal location 23. The configuration of such a control terminal location 23 and the position thereof can be chosen arbitrarily, in principle.

Figure 2A:
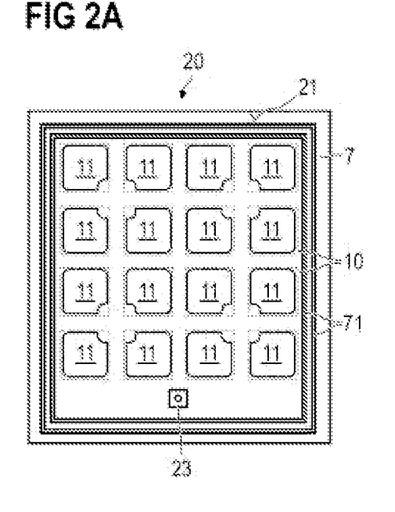
FIG. 2A shows a view of a further chip array, which is provided with a circumferential rib structure for lengthening the electrical creepage path, looking at the top side of said chip array.
Figure 2B:
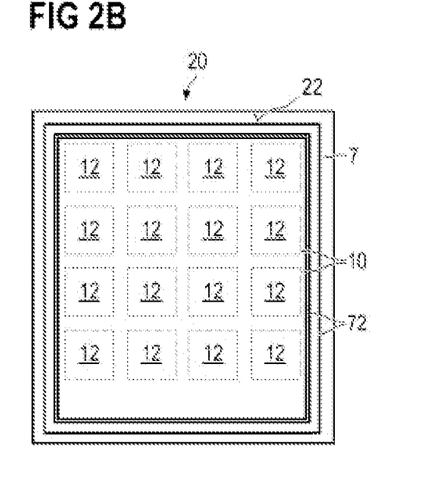
FIG. 2B shows a view of the chip array in accordance with FIG. 2A looking at the underside thereof.

FIG. 2A shows a plan view of a further chip array 20 looking at the top side 21 thereof. The construction of said further chip array corresponds to the construction of the chip array 20 such as has already been explained with reference to FIGS. 1A and 1B. However, the chip array 20 in accordance with FIG. 2A additionally has at its top side 21 one or a plurality of optional ribs 71 which are formed by the embedding compound 7 and each of which encloses the semiconductor chips 10 in a ring-shaped fashion. The ribs 71 bring about a lengthening of the electrical creepage path between the top side 21 and the underside 22 illustrated in FIG. 2B. As can be gathered from FIG. 2B, as an alternative or in addition to the ribs 71 at its top side, the chip array 20 can also have at its underside 22 as well one or a plurality of optional ribs 72 which are formed by the embedding compound 7 and each of which encloses the semiconductor chips 10 in a ring-shaped fashion.

Figure 3:
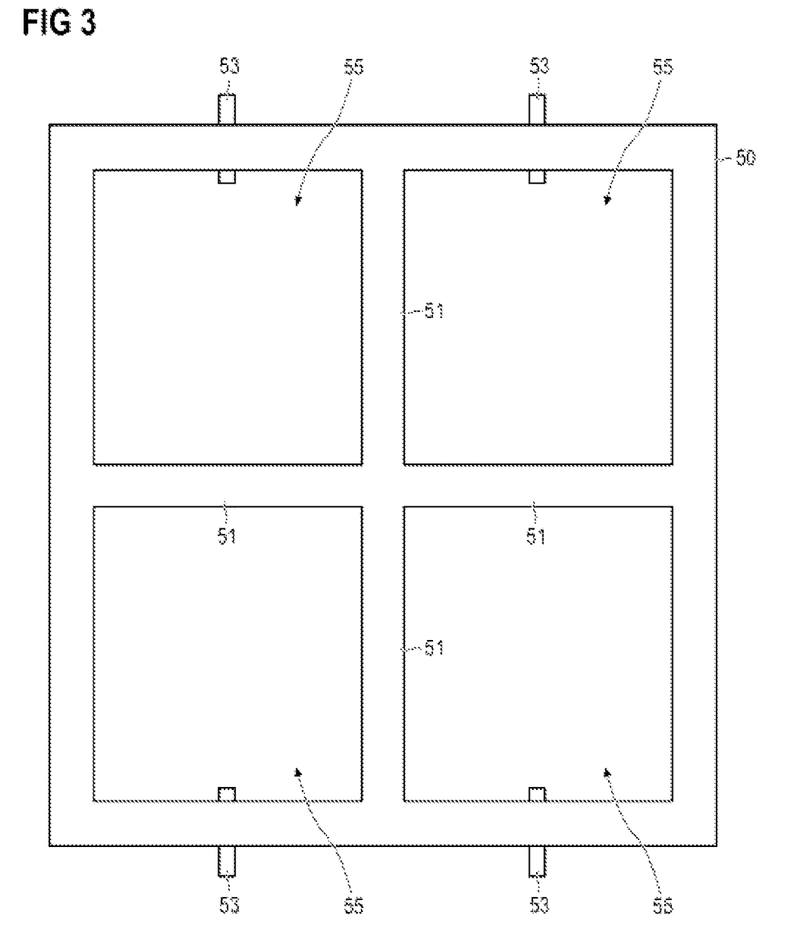
FIG. 3 shows a plan view of a frame which has a plurality of openings and which is provided with optional electrical control terminal contacts.

Two or more chip arrays 20 such as have been explained above can be mounted together in a common, dielectric frame 50. FIG. 3 shows one example of such a frame 50. Generally, such a frame has a number N55≥1 of openings 55, in each of which a chip array 20 can be mounted. In the case of two or more openings 55, the latter are embodied in each case as through openings that are separated from one another by intervening webs 51 of the frame 50. N55 can be for example at least 2, at least 4 or at least 6 or at least 8.

Provided that at least one of the chip arrays 20 contains a controllable semiconductor chip 10, the frame 50 can additionally be provided with one or a plurality of electrically conductive control contacts 53, which can in each case be electrically conductively connected for example to a control terminal location 23 of one of the chip arrays 20, which can be carried out with the aid of arbitrary connection techniques, for example by wire bonding, soldering, or electrically conductive adhesive bonding of an electrical connection conductor, etc. In the case of the present example, the control contacts 53 are embodied in each case as sheet metal strips injected into the frame 50. In principle, however, the configuration of the control contact or control contacts 53 and the position thereof on the frame 50 can be chosen arbitrarily.

Figure 4:
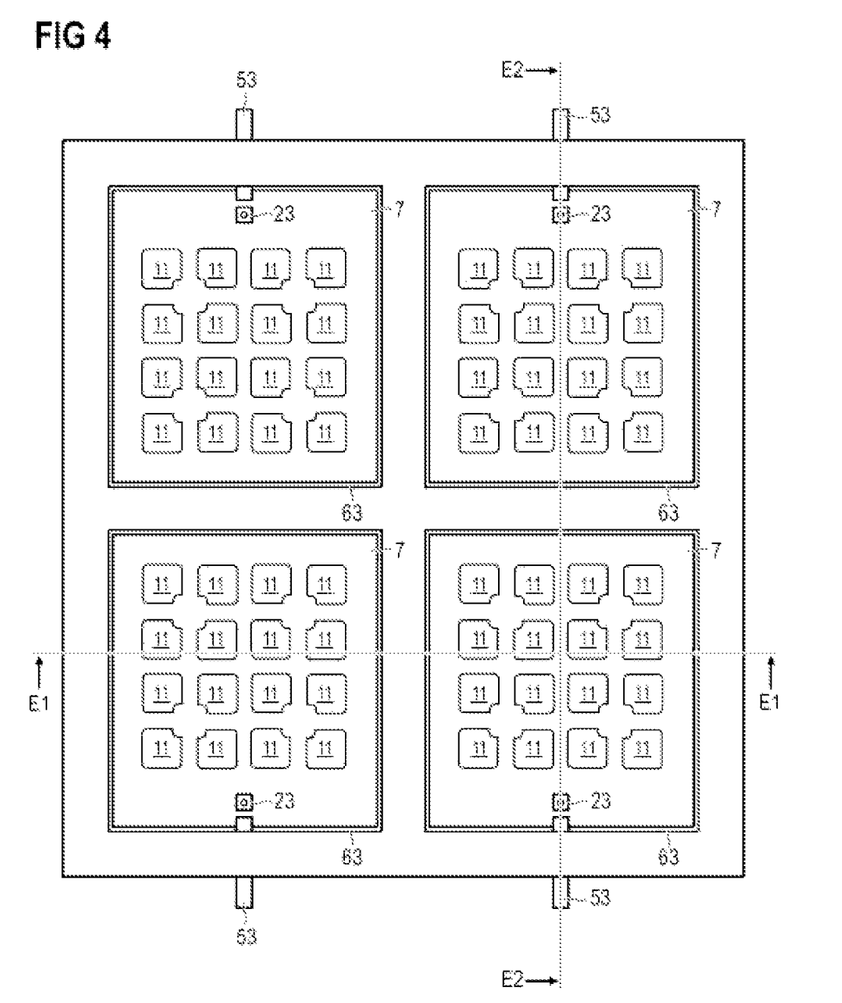
FIG. 4 shows a plan view of the frame in accordance with FIG. 3, wherein a chip array in accordance with FIGS. 1A and 1B is inserted into each of the openings.

FIG. 4 shows the frame 50 in accordance with FIG. 3 after in each case exactly one chip array 20 was inserted into each of the openings 55 of said frame and was fixed to the frame 50 by means of a connection 63, for example an adhesive connection, e.g. composed of a silicone adhesive. The chip arrays 20 can be embodied here in each case in the manner such as has been explained above with reference to FIGS. 1A, 1B, 2A and 2B.

Optionally, in the case of each of the chip arrays 20, a gap formed between said chip array 20 and the frame 50 can be closed off by a connection 63, an adhesive connection. In this case, the connection 63 is embodied as a closed ring enclosing the relevant chip array 20. The relevant chip array 20 and the associated ring-shaped connection 63 completely close off the opening 55 in which the relevant chip array 20 is mounted. As a result, the first load terminals 11 of the semiconductor chips 10 of said chip array 20 are excellently electrically insulated from the second load terminals 12 of the semiconductor chips 10 of said chip array 20, such that measures for lengthening the creepage path, such as the ribs 71 and/or 72 explained with reference to FIGS. 2A and 2B, can be dispensed with. As a result, in the case of the chip arrays 20, a large part of the edge on which the ribs 71 and/or 72 are formed can be obviated, which enables a more compact construction.

As an alternative to connections 63 embodied in each case as a closed ring, a connection 63 between a chip array 20 and the frame 50 along the intervening gap can also be embodied only in portions. By way of example, a chip array 20 can be adhesively bonded to the frame 50 in each case only at a plurality of punctiform or strip-shaped connection locations spaced apart from one another.

Independently of whether or not a connection 63 is embodied as a closed ring, it can optionally be embodied in an elastic fashion, such that the chip arrays 20 are movable relative to the frame 50, which later enables reliable electrical contacting of the chip arrays 20 since manufacturing tolerances are compensated for by the mobility. That means that the relevant chip array 20 can be deflected by at least 0.1 mm or by at least 0.5 mm proceeding from a neutral position under the action of an external force relative to the frame 50 in and/or counter to a direction perpendicular to the first load terminals 11 of the chip array 20 (in FIG. 4, said direction runs perpendicularly to the plane of the drawing), without the connection 63 being destroyed in the process. After the removal of the external force, the chip array 20 assumes its neutral position again, on account of the elasticity of the connection 63 relative to the frame 50.

Figure 5:
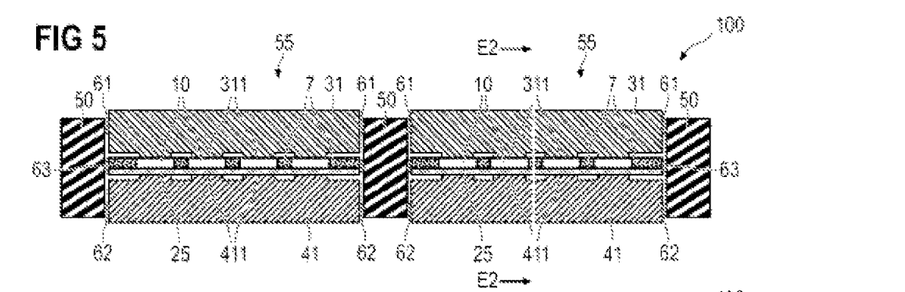
FIG. 5 shows a sectional view of a semiconductor assembly produced on the basis of the arrangement in accordance with FIG. 4 in a sectional plane E1-E1, wherein each of the chip arrays is arranged between a first contact plate and a second contact plate.

FIG. 5 shows a sectional view of a semiconductor assembly 100, based on the arrangement in accordance with FIG. 4, in a sectional plane E1-E1. In this case, each of the chip arrays 20 is arranged between a first contact plate 31 and a second contact plate 41. The contact plates 31 and 41 have not yet been mounted in FIG. 4. The first contact plates 31 serve to electrically contact in each case the first load terminals 11 of exactly one of the chip arrays 20. Correspondingly, the second contact plates 41 serve to electrically contact in each case the second load terminals 12 of exactly one of the chip arrays 20. The semiconductor assembly 100 can therefore comprise two or more pairs each having a first contact plate 31 and a second contact plate 41, between which in each case only exactly one of a plurality of chip arrays 20 is arranged.

As is likewise illustrated in FIG. 5, the contact plates 31, 41 can optionally have a contacting projection 311 and 411, respectively, at their side facing the relevant chip array 20 for each of the semiconductor chips 10 to be electrically contacted by the relevant contact plate 31, 41.

Figure 6:
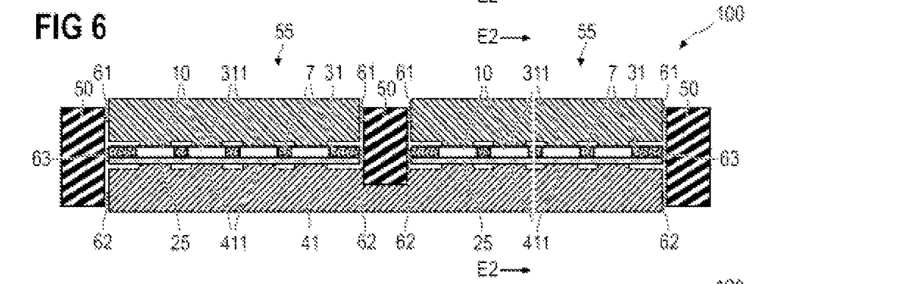
FIG. 6 shows a sectional view of a semiconductor assembly produced on the basis of the arrangement in accordance with FIG. 4 in a sectional plane E1-E1, wherein each of the chip arrays is arranged between an individual first contact plate and a common second contact plate.

In accordance with a further configuration, which is shown in FIG. 6 and otherwise is identical to FIG. 5, instead of a plurality of second contact plates 41, it is also possible for only exactly one second contact plate 41 to be present, which serves for electrically contacting the second load terminals 12 of the semiconductor chips 10 of all the chip arrays 20, while a dedicated first contact plate 31 is present for each of the chip arrays 20 and serves for electrically contacting the first load terminals 11 of the semiconductor chips 10 of said chip array 20. In this case, exactly one of a plurality of chip arrays 20 is arranged between the second contact plate 41 and each of the first contact plates 31.

FIG. 7 again shows the semiconductor assembly 100 in accordance with FIG. 5, but in a sectional plane E2-E2 illustrated in FIG. 4 and running through two of the control contacts 53. It can be discerned here that each of the control contacts 53 extends through the frame 50 into one of the openings 55, where it is connected to the control terminal location 23 of a respective one of the chip arrays 20 by means of an electrical connection conductor 8. The connection conductors 8, which can be for example a bonding wire, a soldered or electrically conductively adhesively bonded wire connection, etc., are not yet present in FIG. 4. They are produced in the case of each of the chip arrays 20 after it was inserted into its opening 55 of the frame 50 and before the associated first contact plate 31 was mounted on the frame 50.

Figure 7:
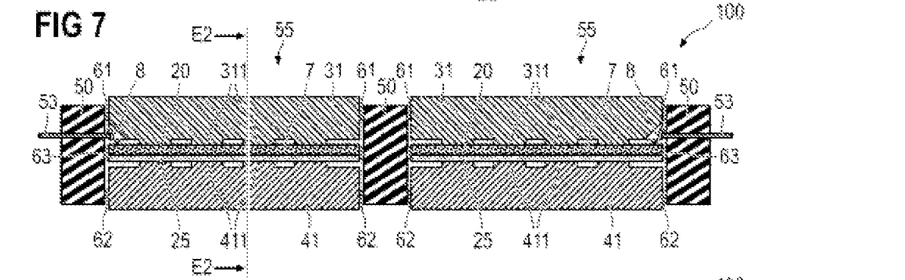
FIG. 7 shows a sectional view of the semiconductor assembly produced on the basis of the arrangement in accordance with FIG. 4 and illustrated in FIG. 5, in a sectional plane E2-E2 illustrated in FIG. 4.
Figure 8:
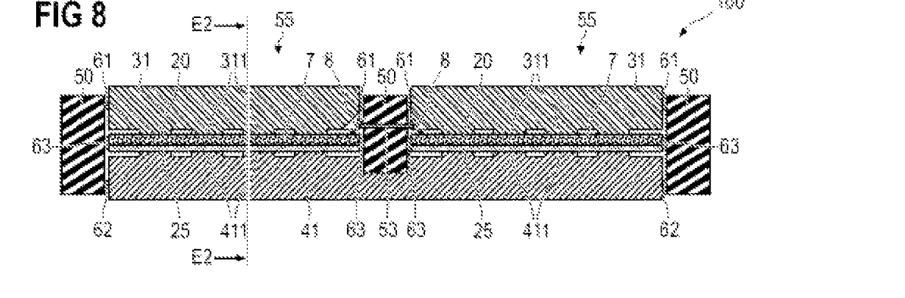
FIG. 8 shows a sectional view of a further exemplary embodiment of a semiconductor assembly, wherein the control terminal locations of a plurality of chip arrays are connected to a common control contact integrated into the frame.

FIG. 8 shows a sectional view of a semiconductor arrangement 100, which differs from the semiconductor arrangement 100 in accordance with FIG. 7 in that, instead of a plurality of control contacts 53, it has only exactly one control contact 53, which is connected to the control terminal locations 23 of each of the chip arrays 20 by means of a respective connection conductor 8.

As is furthermore shown by way of example in all of FIGS. 5 to 8, a compensation film 25 can optionally be present for each of the chip arrays 20, said compensation film being inserted between the relevant chip array 20 and the associated second contact plate 41. The compensation film 25 serves to compensate for manufacturing-dictated tolerances and to ensure a reliable electrical pressure contact connection between the second load terminals 12 of the relevant chip array 20 and the associated second contact plate 41. Such a compensation film 25 can for example consist of copper, aluminum or silver or of an alloy comprising copper, aluminum and/or silver. A compensation film can likewise consist of soft-annealed copper. The thickness of such a compensation film 25 can be for example at least 10 µm and/or at most 100 µm.

Alternatively or additionally, such a compensation film 25 could also be inserted between each of the first contact plates 31 and the associated chip array 20.

As is illustrated in all the FIGS. 5 to 8, each of a plurality of first contact plates 31 can be inserted into that one of the openings 55 of the frame 50 into which is also inserted that one of the chip arrays 20 for whose electrical contacting (electrical contacting of the first load terminals 11 of the semiconductor chips 10 of the chip array 20) the relevant first contact plate 31 serves. In this case, the first contact plate 31 can be fixed to the frame 50 in each case by means of a connection 61, for example an adhesive connection, e.g. composed of a silicone adhesive. Optionally, in the case of each of the first contact plates 31, a gap formed between said first contact plate 31 and the frame 50 can be closed off by the connection 61. In this case, the connection 61 is embodied as a closed ring enclosing the relevant first contact plate 31. The relevant first contact plate 31 and the associated ring-shaped connection 61 completely close off the opening 55 in which the relevant first contact plate 31 is mounted. This makes it possible to prevent dust, dirt and moisture or other harmful substances from penetrating through the gap between the frame 50 and the first contact plate 31 as far as the relevant chip array 20.

As an alternative to connections 61 embodied in each case as a closed ring, a connection 61 between a first contact plate 31 and the frame 50 along the intervening gap can also be embodied only in portions. By way of example, a first contact plate 31 can be fixed to the frame 50 in each case only at a plurality of punctiform or strip-shaped connection locations spaced apart from one another.

Independently of whether or not a connection 61 is embodied as a closed ring, it can optionally be embodied in an elastic fashion, such that the relevant first contact plate 31 is movable relative to the frame 50, which later enables reliable electrical contacting of the associated chip array 20 since manufacturing tolerances are compensated for by the mobility. That means that the relevant first contact plate 31 can be deflected by at least 0.1 mm or by at least 0.5 mm proceeding from a neutral position under the action of an external force relative to the frame 50 in and/or counter to a direction perpendicular to the first load terminals 11 of the associated chip array 20 (in FIGS. 5 to 8, said direction runs vertically), without the connection 61 being destroyed in the process. After the removal of the external force, the first contact plate 31 assumes its neutral position again, on account of the elasticity of the connection 61 relative to the frame 50.

As is illustrated in FIGS. 5 and 7, each of a plurality of second contact plates 41 can be inserted into that one of the openings 55 of the frame 50 into which is also inserted that one of the chip arrays 20 for whose electrical contacting (electrical contacting of the second load terminals 12 of the semiconductor chips 10 of the chip array 20) the relevant second contact plate 41 serves. In this case, the second contact plate 41 can be fixed to the frame 50 in each case by means of a connection 62, for example an adhesive connection, e.g. composed of a silicone adhesive. If the semiconductor assembly 100 otherwise, as shown in FIGS. 6 and 8, comprises only exactly one second contact plate 41, the latter can extend over all of the openings 55 into which a chip array 20 is inserted, and it can be fixed to the frame 50 by means of a connection 62.

In all variants, a gap formed between a second contact plate 41 and the frame 50 can be closed off by an associated connection 62. In this case, the connection 62 is embodied as a closed ring enclosing the relevant second contact plate 41. In the case of a plurality of second contact plates 41, the latter in each case—together with the associated ring-shaped connection 62—completely close off the opening 55 in which the relevant second contact plate 41 is mounted. If the semiconductor assembly 100 otherwise comprises only exactly one second contact plate 41, then the latter together with the ring-shaped connection 62 completely closes off all the openings 55 in which a chip array 20 is mounted. As a result, it is possible to prevent dust, dirt and moisture or other harmful substances from penetration through the gap between the frame 50 and the relevant second contact plate 41 as far as the relevant chip array 20.

As an alternative to connections 62 embodied in each case as a closed ring, a connection 62 between a second contact plate 41 and the frame 50 along the intervening gap can also be embodied only in portions. By way of example, a second contact plate 41 can be fixed to the frame 50 in each case only at a plurality of punctiform or strip-shaped connection locations spaced apart from one another.

Independently of whether or not a connection 62 is embodied as a closed ring, it can optionally be embodied in an elastic fashion, such that the relevant second contact plate 41 is movable relative to the frame 50, which later enables reliable electrical contacting of the associated chip array 20 since manufacturing tolerances are compensated for by the mobility. That means that the relevant second contact plate 41 can be deflected by at least 0.1 mm or by at least 0.5 mm proceeding from a neutral position under the action of an external force relative to the frame 50 in and/or counter to a direction perpendicular to the first load terminals 11 of the associated chip array/chip arrays 20 (in FIGS. 5 to 8, said direction runs vertically), without the connection 62 being destroyed in the process. After the removal of the external force, the second contact plate 41 assumes its neutral position again, on account of the elasticity of the connection 62 relative to the frame 50.

In so far as connections 61 and/or 62 and/or 63 are present in a semiconductor assembly 100 according to the present invention, they can—optionally and independently of the configuration of the other connections—consist of a silicone adhesive, for example.

Figure 9:
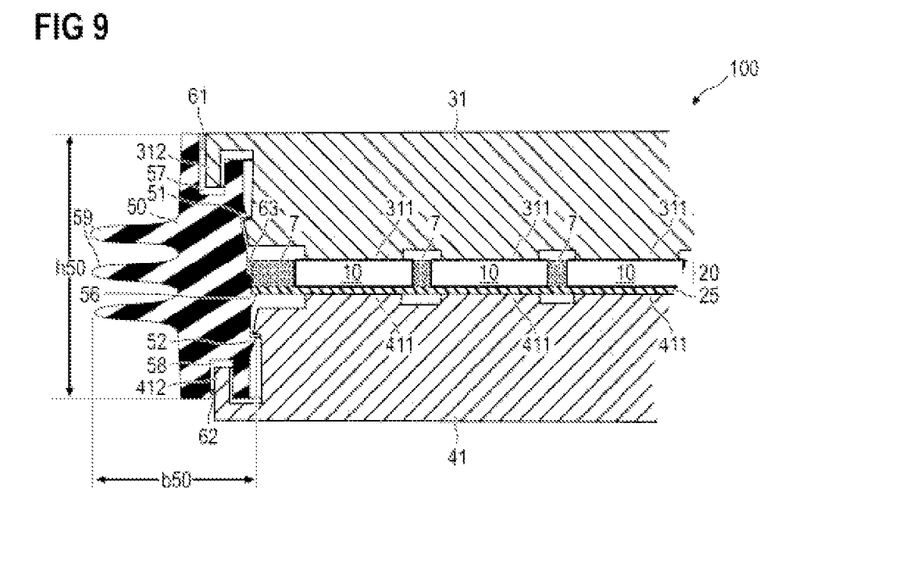
FIG. 9 shows a sectional view of an enlarged portion from the edge region of a semiconductor assembly, wherein a first contact plate and a second contact plate are latched to the frame.
Figure 10:
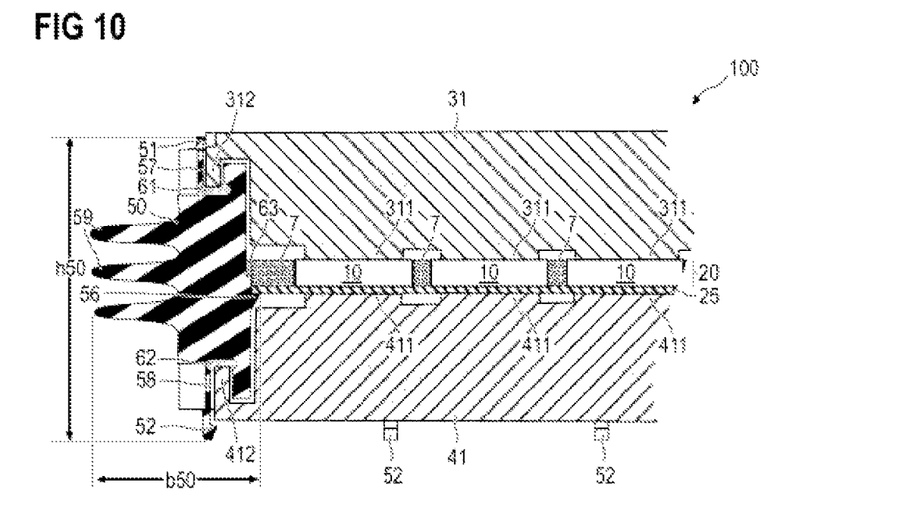
FIG. 10 shows a sectional view of one example of a further semiconductor assembly.

In order to simplify the mounting of the first contact plates 31 and/or of the second contact plates 41 on the frame 50, said contact plates and the frame 50 can be embodied in each case such that they can be latched into the frame 50, which is shown on the basis of two exemplary embodiments shown in FIGS. 9 and 10. For simplifying the mounting, the frame 50 can have for example latching lugs 51 for latching in a first contact plate 31 and respectively latching lugs 52 for latching in a second contact plate 41. For mounting purposes, the relevant contact plate 31, 41 is pushed onto the frame 50 until the contact plate 31, 41 latches in at the associated latching lugs 51 and 52, respectively. In this case, at least three latching lugs 51, 52 can be present for each contact plate 31, 32 to be mounted on the frame 50. Optionally, the latching lugs 51 and/or 52 can be embodied on a respective spring tongue 54 of the frame 50, which is illustrated in FIG. 10.

In order to simplify the mounting of the chip arrays 20 on the frame 50, the frame 50 can have a respective step 53 serving as support for the relevant chip array 20. Moreover, the frame can have one or a plurality of positioning aids adapted to the geometry of the chip array 20 and embodied as projections 56 of the frame 50 and dimensioned such that the chip array 20 can be inserted into the frame 50 without any problems, but such that a positioning accuracy that is sufficient for the further mounting is achieved.

If there is the risk that, in the case of a disturbance of the semiconductor assembly 100, an explosion can occur in the region between the first contact plates 31, the second contact plate or contact plates 41 and the frame 50, it is advantageous if the frame 50 has a sufficient mechanical stability. For this purpose, the geometry of the frame 50 can be designed such that its width b50 is at least 20% of its height h50. In this case, the height h50 is to be determined vertically with respect to the first load terminals 11, and the width b50 transversely with respect thereto.

As further options, which are likewise shown in FIGS. 9 and 10, the frame 50 can have a ring-shaped groove 57 for each of the first contact plates 31 and a ring-shaped groove 58 for each of the second contact plates 41. A ring-shaped collar 312 of a first contact plate 31 in each case engages into the ring-shaped groove 57. Correspondingly, a ring-shaped collar 412 of a second contact plate 41 in each case engages into the ring-shaped groove 58. This results in a type of toothing which inhibits the emergence of constituents of the assembly or gases or plasma in the case of an explosion. Optionally, a gap between the contact plate 31 and 41, respectively, and the frame 50, said gap existing in the region of the respective groove 57, 58 and the collar 312 and 412, respectively, engaging into the latter, can be sealed by a connection 61 and 62, respectively.

In accordance with yet another option shown in FIGS. 9 and 10, the frame 50 can have a plurality of ribs 59 on its outer side facing away from the chip arrays 20, in order to increase the electrical creepage path between the first contact plates 31, on the one hand, and the second contact plate or contact plates 41, on the other hand.

The special features explained with reference to FIGS. 9 and 10 can be used in arbitrary combinations with one another in all semiconductor assemblies 100 such as have been explained above with reference to FIGS. 1A, 1B, 2A, 2B and 3 to 8.

The principles explained above can be realized for semiconductor assemblies 100 comprising an arbitrary number N20 of chip arrays 20. By way of example, N20 can be at least 2, at least 3 or at least 4 or at least 6.

The total number N10 of semiconductor chips 10 which the chip arrays 20 of a semiconductor assembly 100 have together can be for example greater than or equal to 2, greater than or equal to 4, or even greater than or equal to 16.

The semiconductor chips 10 can be arbitrary, in particular vertical, semiconductor components such as diodes, for example, or arbitrary, in particular vertical, controllable semiconductor switches such as IGBTs, MOSFETs, thyristors, JFETs. In the case of controllable semiconductor switches, the latter have a control terminal (e.g. a gate or base terminal), via which an electric current flow between the first load terminal 11 and second load terminal 12 of this semiconductor chip 10 can be controlled.

Depending on the type of a semiconductor chip 10, the first load terminals 11 and the second load terminals 12 can be anode and cathode, cathode and anode, drain and source, source and drain, emitter and collector or collector and emitter. In this case, the load terminals 11 and 12 can be embodied as thin metalizations of the semiconductor chip 10. Optionally, in addition to the thin metalization, one or both load terminals 11 and 12 can have an electrically conductive compensation layer that is arranged on that side of the thin metalization which faces away from the other of the load terminals 12, 11, and is electrically conductively connected to the thin metalization by a cohesive connection (e.g. soldering connection or sintering connection) embodied in a planar fashion. By way of example, such a compensation layer can be a metalic lamina, e.g. composed of molybdenum, which has a mechanically compensating effect during the subsequent mounting of the semiconductor chip 10.

If none of the semiconductor chips 10 of a chip array 20 has a control terminal, a control terminal location 23 is unnecessary in this chip array 20. Furthermore, if none of the semiconductor chips 10 of the semiconductor assembly 100 is embodied as a controllable semiconductor chip 10, it is additionally unnecessary to provide one or a plurality of control contacts 53 on the frame 50.

Furthermore, if one, a plurality or all of the semiconductor chips 10 of a chip array 20 has/have an auxiliary terminal (for example an auxiliary emitter) electrically connected to one of the load terminals 11 or 12 on-chip, said auxiliary terminal can be electrically contacted in the same way as was described above for a control terminal (gate terminal, base terminal). That means that a chip array 20 containing one or a plurality of semiconductor chips 10 having such an auxiliary terminal can have an auxiliary terminal location (corresponding to the control terminal location 23 described). Such an auxiliary terminal location can furthermore be electrically connected (e.g. by means of a connection conductor such as the electrical connection conductor 8 described) to an auxiliary terminal contact which can be embodied in accordance with a control contact 53 described and can be integrated into the frame 50.

In the case of a semiconductor assembly 100 as described above, the frame 50 can be dielectric. By way of example, such a frame 50 can consist of plastic or comprise plastic, e.g. a thermosetting plastic or a thermoplastic. Such a frame 50 can be produced in a simple manner by injection molding. As an alternative thereto, a dielectric frame 50 can also consist of a dielectric ceramic or comprise a dielectric ceramic.

As shown by the exemplary embodiments above, connections 61 and/or 62 and/or 63 can be embodied as adhesive connections, for example composed of a silicone adhesive. However, it is likewise possible for one, two or more arbitrary connections from among said connections to be formed by a metal spring.

Figure 11:
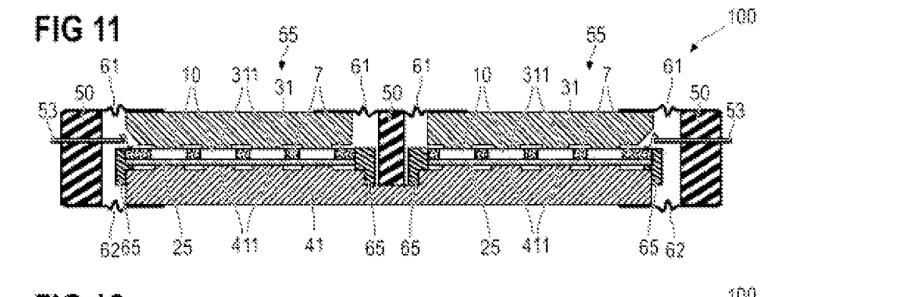
FIG. 11 shows a sectional view of a semiconductor assembly, wherein the connections between the frame and the contact plates are embodied as metal springs.
Figure 12:
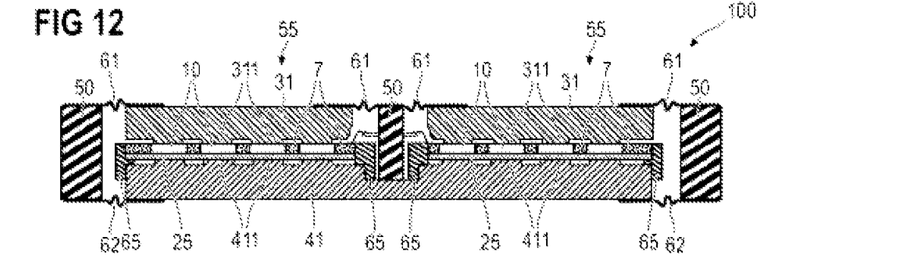
FIG. 12 shows a sectional view of a further semiconductor assembly, wherein the connections between the frame and the contact plates are embodied as metal springs.

Examples of corresponding semiconductor assemblies 100 are shown in FIGS. 11 and 12. In the case of these semiconductor assemblies 100, the connections 61 are formed in each case by a metal spring. Each of the metal springs 61 is soldered or welded onto a metalization (applied to the frame 50 electrolytically, for example) of the frame 50. Moreover, each of the metal springs 61 is soldered or welded onto one of the first contact plates 31.

Alternatively or additionally, the connections 62 can also be formed in each case by a metal spring. Each of the metal springs 62 is soldered or welded onto a metalization (applied to the frame 50 electrolytically, for example) of the frame 50. Moreover, each of the metal springs 61 is soldered or welded onto the second contact plate 41 or—if the semiconductor assembly 100, as described for example with reference to FIGS. 5 and 7, comprises more than exactly one second contact plate 41—onto one of the second contact plates 41.

By virtue of the connections 61 and 62 being embodied in each case as metal springs, these together with the frame 50 can form a housing having a gas-tight interior in which all the chip arrays 20 are arranged.

In so far as one of the connections 61, 62 is embodied as a metal spring, the latter can have a cross-sectionally wavy portion in order to increase the elasticity of the metal spring 61 or 62. Such a metal spring is also designated as corrugated membrane. As a result of the wavy portion, the linearity range of the force-distance profile of such a spring extends over a large excursion range of the spring. The metal springs 61 and/or 62 can be embodied such that the associated first contact plate 31 and/or the associated second contact plate 41 can be deflected by at least 0.1 mm or by at least 0.5 mm proceeding from a neutral position under the action of an external force relative to the frame 50 in and/or counter to a direction perpendicular to the first load terminals 11 of the associated chip array 20 (said direction runs vertically in FIGS. 11 and 12), without the connection 61 and/or 62 being destroyed in the process. After the removal of the external force, the first contact plate 31 and/or the second contact plate 41 assume(s) the neutral position thereof again relative to the frame 50 on account of the elasticity of the connection 61 and/or 62.

The metal springs mentioned can for example consist of one of the following materials or comprise one of the following materials: copper; bronze.

Furthermore, each of the chip arrays 20 is fixed in an inner frame 65 in order to facilitate the mounting or the adjustment of the relevant chip array 20 relative to the second contact plate 41 or—if the semiconductor assembly 100 as described for example with reference to FIGS. 5 and 7 comprises more than exactly one second contact plate 41—relative to one of the second contact plates 41. Instead of a common inner frame 65 for all the chip arrays 20 of the semiconductor assembly 100, it is also possible for each of the chip arrays 20 to have a dedicated inner frame. In this case, the designation "inner frame" means that it is arranged within the frame 50, that is to say is enclosed by the latter in a ring-shaped fashion.

For the rest, the construction of the semiconductor assemblies 100 in accordance with FIGS. 11 and 12 corresponds to the construction explained with reference to the previous figures. With regard to the interconnection of the control contacts 53, the semiconductor assemblies 100 in accordance with FIGS. 11 and 12 correspond to the semiconductor assemblies 100 in accordance with FIGS. 7 and 8, respectively.

In the case of the arrangements in accordance with FIGS. 11 and 12, although no third connection is provided between the frame 50 and each of the chip arrays 20, a third connection could optionally nevertheless be present. It could be embodied as an adhesive connection, for example composed of a silicone adhesive.

Figure 13:
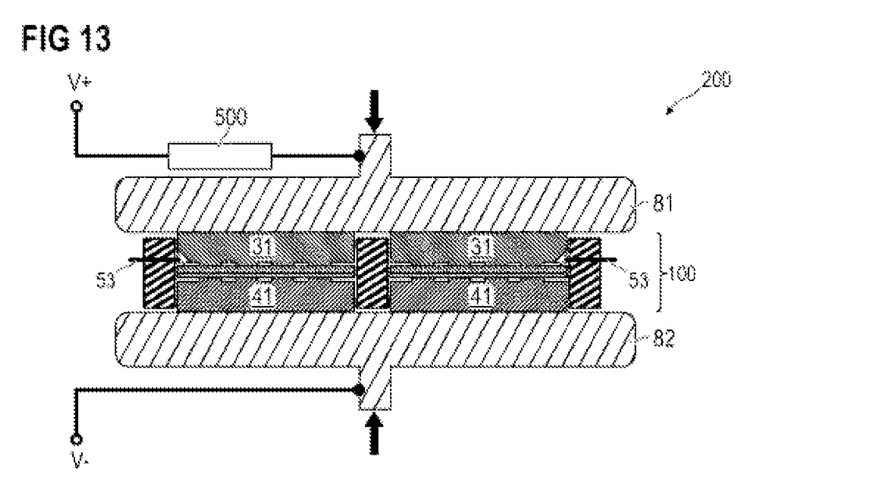
FIG. 13 shows a semiconductor arrangement comprising a semiconductor assembly which is clamped in between an upper pressure contact piece and a lower pressure contact piece.

A semiconductor assembly 100 according to the present invention, as is shown in FIG. 13 by way of example on the basis of the semiconductor assembly 100 illustrated in FIG. 7, can then be clamped in between an electrically conductive first pressure piece 81 and an electrically conductive second pressure piece 82 in such a way that there is in each case a pure electrical pressure contact connection between the first pressure piece 81 and the first contact plate or contact plates 31 and between the second pressure piece 82 and the second contact plate or contact plates 41.

In the case of the semiconductor assembly 100, the electrical contacts between a first contact plate 31 and the first load terminals 11 to be electrically contacted by the latter can likewise be embodied as pure electrical pressure contacts. Alternatively or additionally, the electrical contacts between a second contact plate 31 and the second load terminals 12 to be electrically contacted by the latter can also likewise be embodied as pure electrical pressure contacts.

The finished pressure contact arrangement 200 comprising the semiconductor assembly 100, the upper pressure piece 81 and the lower pressure piece 82 can then be electrically interconnected. By way of example, the pressure contact arrangement 200 can be connected in series with a resistive and/or inductive load 500 between a positive supply potential V+ and a negative supply potential V−. The absolute value of the potential difference between the positive supply potential V+ and the negative supply potential V− can be for example more than 600 V or more than 1.2 kV.

What is claimed is:

1. A semiconductor assembly, comprising:
   a frame having a number N55≥1 of openings;
   a number N55 of electrically conductive first contact plates; and
   a number N55 of chip arrays, each of which has a number N10≥2 of that are cohesively connected to one another by an embedding compound to form a fixed assemblage;
   wherein
   each of the semiconductor chips has a first load terminal and a second load terminal, which are arranged at mutually opposite sides of the relevant semiconductor chip;
   one of the chip arrays is inserted into each of the openings;
   each of the first contact plates is arranged above one of the chip arrays in such a way that, in the case of each of the semiconductor chips of said chip array, and wherein the first load terminal is situated at that side of said semiconductor chip which faces the first contact plate and the second load terminal is situated at that side of said semiconductor chip which faces away from the first contact plate.

2. The semiconductor assembly as claimed in claim 1, wherein each of the first contact plates is fixed to the frame movably by means of a first connection.

3. The semiconductor assembly as claimed in claim 2, wherein, in the case of each of the first contact plates, the relevant first connection is embodied as a closed ring, which completely seals a gap formed between said first contact plate and the frame.

4. The semiconductor assembly as claimed in claim 2, wherein each of the first connections is formed by a silicone adhesive or a metal spring.

5. The semiconductor assembly as claimed in claim 1, comprising exactly one electrically conductive second contact plate, which is arranged below all of the chip arrays in such a way that, in the case of each of the semiconductor chips of the chip arrays, the second load terminal is situated at that side of said semiconductor chip which faces the second contact plate and the first load terminal is situated at that side of said semiconductor chip which faces away from the second contact plate.

6. The semiconductor assembly as claimed in claim 1, comprising a number N55 of second contact plates, each of which is arranged below one of the chip arrays in such a way that, in the case of each of the semiconductor chips of said chip array, the second load terminal is situated at that side of said semiconductor chip which faces the second contact plate and the first load terminal is situated at that side of said semiconductor chip which faces away from the second contact plate.

7. The semiconductor assembly as claimed in claim 6, wherein each second contact plate is fixed to the frame movably by means of a second connection.

8. The semiconductor assembly as claimed in claim 7, wherein, in the case of each of the second contact plates, the relevant second connection is embodied as a closed ring, which completely seals a gap formed between said second contact plate and the frame.

9. The semiconductor assembly as claimed in claim 7, wherein each second connection is formed by a silicone adhesive or a metal spring.

10. The semiconductor assembly as claimed in claim 1, wherein each of the chip arrays is fixed to the frame movably by means of a third connection.

11. The semiconductor assembly as claimed in claim 10, wherein, in the case of each of the chip arrays, the relevant third connection is embodied as a closed ring, which completely seals a gap formed between said chip array and the frame.

12. The semiconductor assembly as claimed in claim 10, wherein each third connection is formed by a silicone adhesive.

13. The semiconductor assembly as claimed in claim 1, wherein the embedding compound of each of the chip arrays comprises plastic or consists of plastic.

14. A pressure contact arrangement comprising:
   a semiconductor assembly as claimed in claim 1;
   a first pressure piece; and
   a second pressure piece;
   wherein the semiconductor assembly is clamped in between the first pressure piece and the second pressure piece in such a way that
   there is an electrically conductive pressure contact between the first pressure piece and each of the first contact plates; and
   there is an electrically conductive pressure contact between the second pressure piece and each of the second contact plates.

15. The semiconductor assembly as claimed in claim 1, wherein the frame is a planar dielectric structure with N55≥2 openings, wherein each of the openings has a shape that is complementary to the a shape of the one of the chip arrays.

* * * * *

UNITED STATES PATENT AND TRADEMARK OFFICE
CERTIFICATE OF CORRECTION

PATENT NO. : 9,524,951 B2
APPLICATION NO. : 14/669208
DATED : December 20, 2016
INVENTOR(S) : O. Hohlfeld It is certified that error appears in the above-identified patent and that said Letters Patent is hereby corrected as shown below:

On the Title Page

Item [57], Line 14, change "situated a of" to -- situated at that side of --

Signed and Sealed this
Fifth Day of December, 2017

Joseph Matal
*Performing the Functions and Duties of the*
*Under Secretary of Commerce for Intellectual Property and*
*Director of the United States Patent and Trademark Office*